United States Patent [19]

Suzuki

[11] Patent Number: 4,546,538
[45] Date of Patent: Oct. 15, 1985

[54] METHOD OF MANUFACTURING SEMICONDUCTOR INTEGRATED CIRCUIT DEVICES HAVING DIELECTRIC ISOLATION REGIONS

[75] Inventor: Kenichi Suzuki, Tokyo, Japan

[73] Assignee: Oki Electric Industry Co., Ltd., Tokyo, Japan

[21] Appl. No.: 647,827

[22] Filed: Sep. 5, 1984

[30] Foreign Application Priority Data

Sep. 5, 1983 [JP] Japan .................. 58-161900

[51] Int. Cl.⁴ ................ H01L 21/31; H01L 21/76
[52] U.S. Cl. ...................... 29/576 W; 29/576 E; 29/578; 29/580; 148/175; 148/DIG. 50; 148/DIG. 51; 148/DIG. 85; 148/DIG. 117; 156/643; 156/649; 156/653; 156/657; 156/659.1; 357/49; 357/50
[58] Field of Search .............. 29/576 W, 576 E, 578, 29/580; 148/175; 156/643, 649, 653, 657, 659.1; 357/49, 50

[56] References Cited

U.S. PATENT DOCUMENTS

| | | | |
|---|---|---|---|
| 3,900,350 | 8/1975 | Appels et al. | 148/175 |
| 3,961,999 | 6/1976 | Antipov | 29/576 W |
| 4,396,460 | 8/1983 | Tamaki et al. | 156/653 |
| 4,471,525 | 9/1984 | Sasaki | 29/576 W |
| 4,473,598 | 9/1984 | Ephrath et al. | 29/576 W |

FOREIGN PATENT DOCUMENTS

| | | | |
|---|---|---|---|
| 57-211747 | 12/1982 | Japan | 29/576 W |
| 58-140137 | 8/1983 | Japan | 29/576 W |

OTHER PUBLICATIONS

Kahng et al., "Method for Area Saving . . . Oxidation . . . Sidewalls", J. Electrochem. Soc. (S.S.T. & T) vol. 127, No. 11, Nov. 1980, pp. 2468-2471.
Hayasaki et al., "U-Groove Isolation . . . Bipolar VLSIC'S", International Electron Devices MTG-82, 1982, pp. 62-65.

Primary Examiner—William G. Saba
Attorney, Agent, or Firm—Wenderoth, Lind & Ponack

[57] ABSTRACT

A method of making semiconductor integrated circuit devices with narrow and deep isolation regions of polycrystalline silicon and wide and thick isolation regions of thermally grown silicon oxide. A multi-layer of a first silicon nitride layer, a polycrystalline silicon layer, a second silicon nitride layer and a silicon oxide layer are formed on a semiconductor body. A photoresist layer is applied on the surface of the silicon oxide layer. An opening is formed in the photoresist layer and the multi-layer. The silicon oxide layer under the photoresist layer is side-etched through the opening. The exposed polycrystalline layer is converted into another silicon oxide layer. Another opening surrounding the silicon oxide layer is formed to expose surfaces of the semiconductor body. Deep grooves are formed in the semiconductor body.

7 Claims, 14 Drawing Figures

METHOD OF MANUFACTURING SEMICONDUCTOR INTEGRATED CIRCUIT DEVICES HAVING DIELECTRIC ISOLATION REGIONS

BACKGROUND OF THE INVENTION

This invention relates to dielectric isolation for integrated semiconductor devices, and more particularly to a method of manufacturing semiconductor integrated circuit devices, which is adapted to simultaneously form a narrow and deep isolation region and a wide and thick field region.

In bipolar type integrated semiconductor circuit devices, the active regions or elements are electrically isolated by the PN junctions. However, with increasing demand for smaller device sizes and higher element densities, it has become necessary to reduce the isolation areas. The PN junction isolation has been gradually superseded by the oxide isolation (the so-called Isoplanar) using a thick oxide formed in the silicon substrate through selective oxidation.

The oxide isolation method typically comprises the steps of; placing on a silicon substrate an oxidation-resistant masking layer formed of a composite layer of a thin silicon oxide film and a silicon nitride film, etching the surface of the silicon substrate to form mesa regions for active elements under the masking layers, and thermally oxidizing the silicon substrate to form thick silicon oxide as field isolation regions surrounding the mesa regions.

As compared with the PN junction isolation, the oxide isolation can reduce the areas of the isolation regions, and can also reduce stray capacitances between the surface conductors and the substrate due to the thick silicon oxide (hereinafter called "the field region(s)") forming all regions other than the active regions, thereby contributing to an increase of the switching speed of the resulting transistors.

However, during the above thermal oxidation step, since lateral oxidation causes formation of the "bird's beak" or "bird's head" in the silicon substrate under the oxidation-resistant masking layer, the widths of the isolation regions become greater than an allowable minimum dimension obtained by the conventional photolithography.

Therefore, the bird's beak and bird's head make difficult to obtain finer isolation regions less than 10 μm, and also spoil the formation of a planar surface over the substrate.

To overcome such disadvantages, an improved isolation technique is represented, e.g. by a process described in a paper entitled "A Method for Area Saving Planar Isolation Oxidation Protected Sidewalls" by D. Kahng et al, published in Solid-State Science And Technology issued by J. Electro-Chemistry Society, Vol. 127, No. 11, November, 1980, pp. 2468-2470. According to this process, in addition to a first oxidation-resistant layer of silicon nitride deposited over the top surfaces of mesa regions, a second oxidation-resistant layer of silicon nitride is deposited by chemical vapor diposition on the sidewalls of the mesa regions. The Improved Selective Oxidation Process can thus prevent widening of the isolation regions caused by the lateral oxidation, and also can prevent the formation of bird's beak and bird's head so as to achieve the flattened silicon substrate surface irrespective of the width of the isolation regions to be formed.

However, according to this process, it takes an impracticably very long time to form deep and narrow isolation regions extending through an epitaxial layer on the entire surface of the silicon substrate by oxidation process. To shorten the oxidation time, buried regions have to be formed in the surface of a silicon substrate by using another photomask before the formation of an epitaxial layer on the entire surface of the silicon substrate. This requires more critical mask aligning tolerances in aligning a second mask with the formerly formed buried region. Furthermore, since a P⁻ channel stop layer formed under the bottom of the isolation region is placed so as to contact with N⁻ buried regions, the junction capacitance between the P⁻ channel stop region and the N⁺ buried region tends to increase. Also, this process tends to increase leak current between the base region and the P+ channel stop layer, resulting in reduced breakdown voltage.

Recently, a U-groove isolation technique has been developed, which utilizes a reactive ion-etching (RIE) process capable of etching a silicon substrate vertically to the substrate to form deep grooves of a given width having vertical sidewalls. The U-groove isolation technique is described in a paper entitled "U-Groove Isolation Technique For High Speed Bipolar VLSIC's" by Akio Hayasaka et al, published in IEDM 82, 1982, pp. 62–65. According to this process, a silicon substrate is etched by using RIE to form deep, sheer U-grooves or -trenches. The grooves are oxidized to form a silicon dioxide layer along their walls, and covered with a silicon nitride layer. A polycrystalline silicon material is then deposited over the silicon substrate so as to bury the grooves, and then etched back to form a flat surface on the silicon substrate.

In fabricating bipolar integrated circuit devices by means of the U-groove isolation process, deep isolation grooves can be formed in the silicon substrate so as to penetrate a buried layer formed by diffusion throughout the whole area of the silicon substrate, thereby dispensing with the use of a mask for formation of such buried layer, which has conventionally been employed.

However, according to the U-groove isolation process, it is difficult to obtain a flat surface over larger width field regions formed by filling with dielectric material in a wide groove. That is, an additional mask is required to obtain flattened surfaces, which leads to an increased number of fabricating steps, and also requires critical aligning tolerances.

SUMMARY OF THE INVENTION

Accordingly, it is an object of this invention to provide a method of fabricating integrated semiconductor circuit devices, which is capable of simultaneously fabricating a narrow and deep isolation region and a wide and thick field isolation region.

It is a further object of this invention to provide a method of fabricating integrated semiconductor circuit devices, which is capable of providing a flat planar surface without any bird's beak or bird's head on a semiconductor body by utilizing simple steps without requiring critical mask aligning tolerances.

It is a still further object of this invention to provide a method of fabricating semiconductor integrated circuit devices, which can reduce the parasitic capacitance between the surface conductors and the substrate.

Throughout the present invention, the terms "grooves" and "trenches" are used interchangeably.

The present invention provides a method of forming a structure adapted for formation of integrated circuit devices on a semiconductor body. A first oxidation-resistant layer, a polycrystalline silicon layer, a second oxidation-resistant layer and an etching-resistant layer are sequentially formed on the top surface of a semiconductor body. A photoresist layer is applied on the entire surface of the etching-resistant layer. The photoresist layer is selectively removed to form a photoresist mask having an opening. The opening is walled by a first photoresist layer over a portion of the semiconductor body intended as a deeper isolation region and a second photoresist layer over a portion of the semiconductor body intended as a wider and thick isolation region. The second oxidation-resistant layer in the opening is removed to expose a surface of the polycrystalline silicon layer. The structure obtained by the steps is subjected to an isotropic etching process to side-etch the etching-resistant layer under the second photoresist layer by a desired width, while the etching-resistant layer under the first photoresist layer is completely removed away. The first and second photoresist layers are removed to expose the etching-resistant layer and the second oxidation-resistant layer. The structure obtained by the steps is subjected to a heat oxidation process to convert the exposed polycrystalline silicon layer into a silicon oxide layer. The structure obtained by the steps is subjected to an etching process to sequentially remove the exposed second oxidation-resistant layer, the polycrystalline silicon layer and the first oxidation-resistant layer. The structure obtained by the steps is subjected to etching process to form deep grooves surrounding active regions in the semiconductor body by using as an etching mask the etching-resistant layer and the silicon oxide layer.

The above and other objects, features and advantages of the invention will be more apparent from the ensuring detailed description taken in conjunction with the accompanying drawings.

DESCRIPTION OF THE PREFERRED EMBODIMENT

Figure 1A:
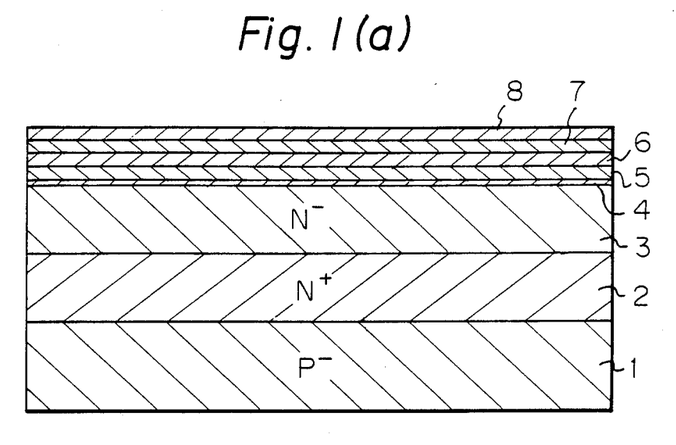
FIGS. 1(a) to 1(n) are sectional views showing steps of making a semiconductor device according to this invention.

First, in FIG. 1(a), a P$^-$ silicon substrate 1 is prepared, which has an N$^+$ diffused silicon layer 2 on the entire surface thereof. Then, an N$^-$ silicon layer 3 is epitaxially grown on the entire surface of the N$^-$ silicon layer 2. The structure obtained above is thermally oxidized to form a buffer silicon oxide layer 4 of 300 to 1000 Å in thickness on the entire surface of the N$^-$ epitaxial silicon layer 3. A first silicon nitride layer 5 is deposited on the entire surface of the silicon oxide layer 4 by a conventional chemical vapor deposition (CVD) process. The first silicon nitride layer 5 is preferably about 2000 Å in thickness. A polycrystalline silicon layer 6 having a thickness of 200 to 3000 Å is deposited on the surface of the silicon nitride layer 5 by a CVD process. A second silicon nitride layer 7 is chemically deposited on the entire surface of the polycrystalline silicon layer 6. The second silicon nitride layer 7 has preferably a thickness of 1000 to 2000 Å. A second silicon oxide layer 8 of 2000 to 3000 Å in thickness is formed on the surface of the second silicon nitride layer 7 by CVD process.

The silicon layers 1, 2 and 3 will be hereinafter called generically "the semiconductor body".

Figure 1B:
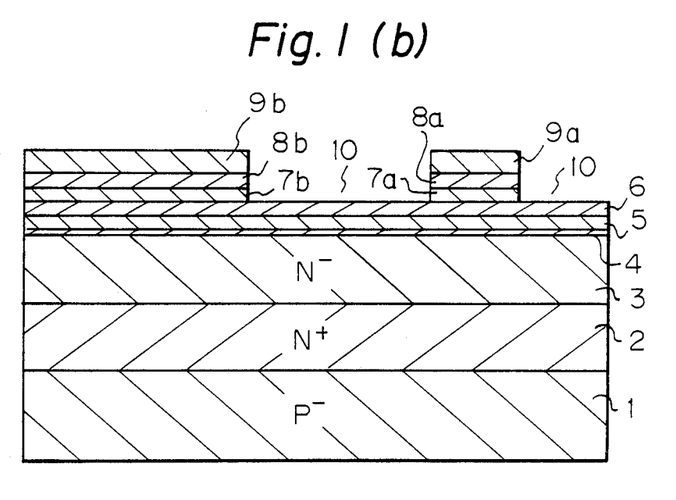

Next, a photoresist film is applied on the entire surface of the silicon oxide layer 8 to form etching mask layers 9a and 9b of 1 to 2 μm in thickness by the conventional photolithography. The structure obtained above is subjected to a reactive ion-etching process to remove the exposed silicon oxide layer 8 and the silicon nitride layer 7, so that openings 10 are formed over selected surfaces of the silicon body intended as active regions. In this case, a narrow and deep isolation region is to be formed in the N$^-$ epitaxial silicon layer under the etching mask 9a and a wide and thick isolation region (field isolation region) in the N$^-$ epitaxial silicon layer under the etching mask 9b (see FIG. 1(b)).

Figure 1C:
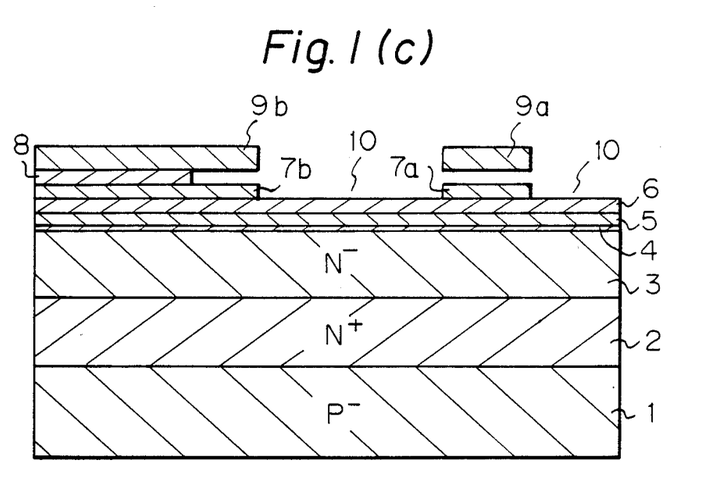

Next, the structure obtained above is subjected to an isotropic etching process, so that the silicon oxide layer 8b under the etching mask 9b is side-etched by the substantially same width as that of the etching mask 9a, while the silicon oxide film 8a under the etching mask 9a is completely removed away.

During this process, the etching mask 9a will remain bridging over the silicon nitride layer 7 (see FIG. 1(c)).

Figure 1D:
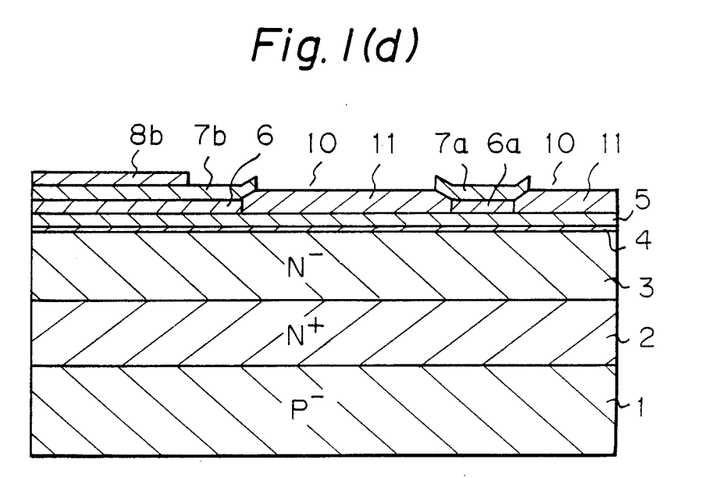

Next, after removing the etcing masks 9a and 9b, the structure obtained above is subjected to an oxidation process to convert the exposed polycrystalline silicon layer 6 into a thermally grown silicon oxide layer 11 (see FIG. 1(d)).

Figure 1E:
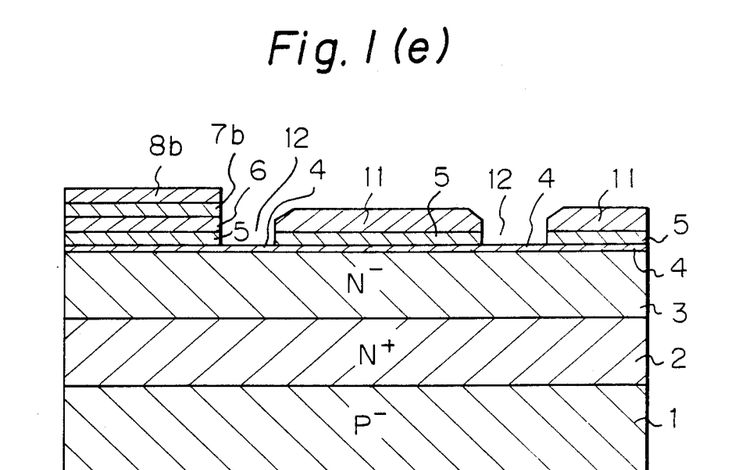

Next, by using as etching masks both the CVD silicon oxide layer 8 and the thermally grown silicon oxide layer 11, the structure obtained above is subjected to a reactive ion-etching process, so that the exposed layers 7, 6 and 5 are removed to form openings 12 (see FIG. 1(e)).

Figure 1F:
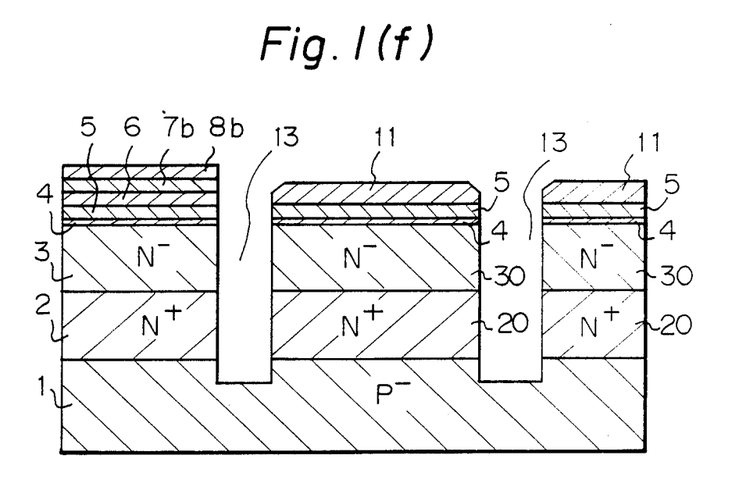

Next, the structure obtained above is subjected to a reactive ion-etching process to form deep grooves 13 of e.g. 4 to 5 μm in depth. The grooves 13 reaches the P$^-$ silicon substrate 1 through both the epitaxial layer 3 and the buried diffused layer 2, and defines an active region including an N$^+$-buried layer 20 and an N$^-$ collector layer 30 (see FIG. 1(f)).

Figure 1G:
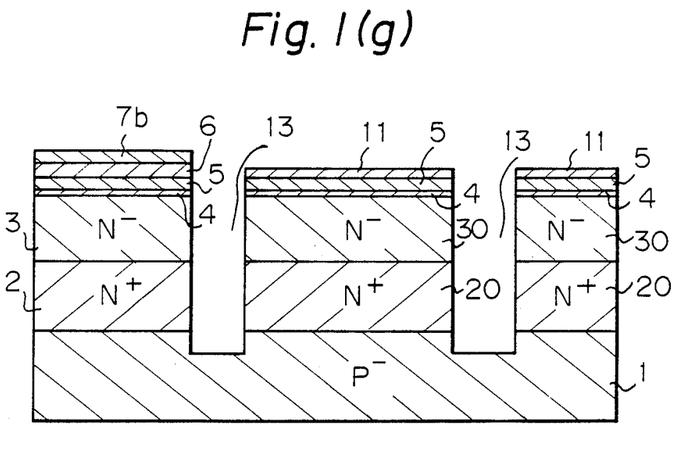

Next, the CVD silicon oxide layer 8b is completely removed by utilizing the differences in thickness and in etching rate between the silicon oxide layers 8b and 11 (see FIG. 1(g)).

Figure 1H:
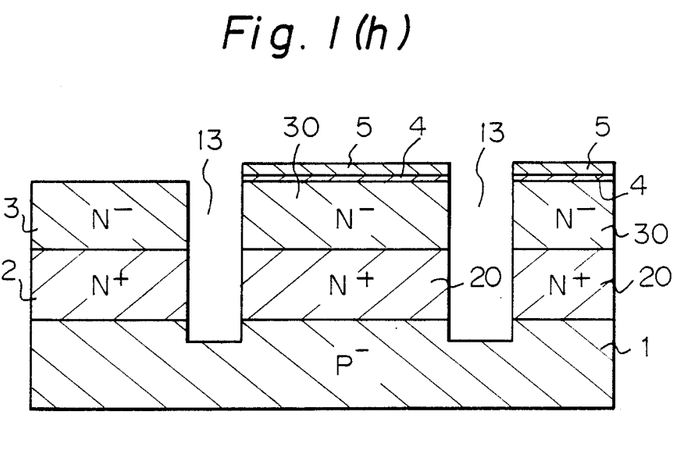

Then, by using as an etching mask the silicon oxide layer 11, both the silicon nitride layers 5, 7 and the polycrystalline silicon layer 6 are selectively removed. Then the exposed buffer silicon oxide layer 4 and the thermally grown silicon oxide layer 11 are removed to expose the surface of the epitaxial layer 3 and the surface of the first silicon nitride layer 5, respectively (see FIG. 1(h)). In this case, the thermally grown silicon oxide layer 11, if necessary, may be left to use as an etching mask in a later step.

Figure 1I:
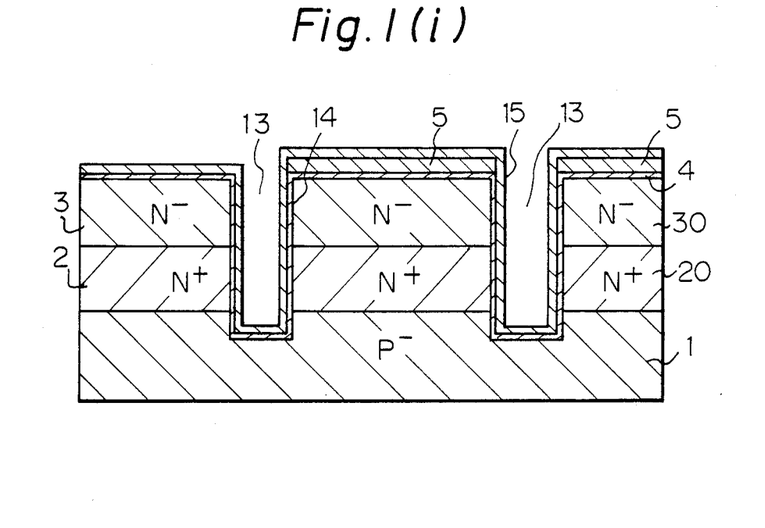

Next, a buffer silicon oxide layer 14 of 300 to 1000 Å in thickness is thermally grown on the entire surface of the structure obtained above, and then a third silicon nitride layer 15 of 1000 to 2000 Å in thickness is chemically deposited on the entire surface of the silicon oxide layer 14 (see FIG. 1(i)).

Figure 1J:
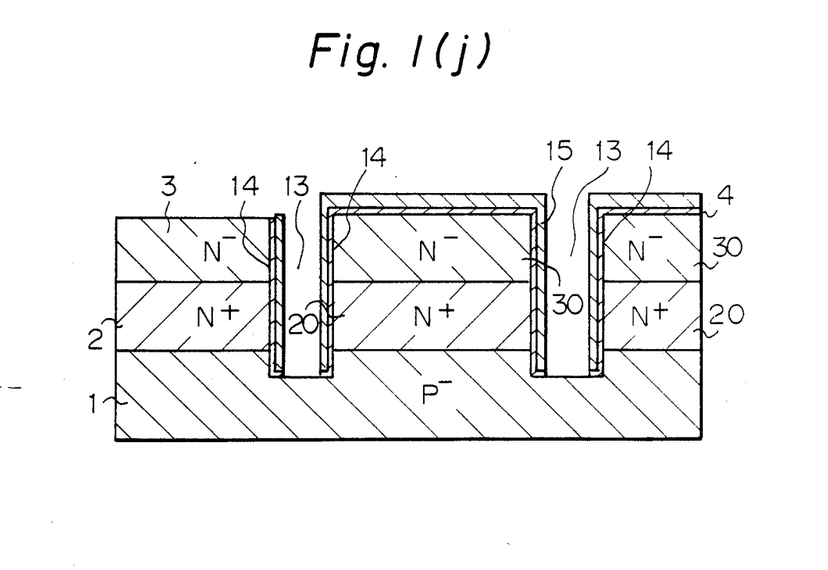

Next, by using the reactive ion-etching process, the silicon nitride layer 15 and the silicon oxide layer 14 are selectively removed to expose the surfaces of both the N$^-$ silicon layer 3 and of the base of the grooves 13 (see FIG. 1(j)). In this case, if necessary, channel stop regions may be formed by ion-implanting bron atoms at the bases of the grooves 13.

Figure 1K:
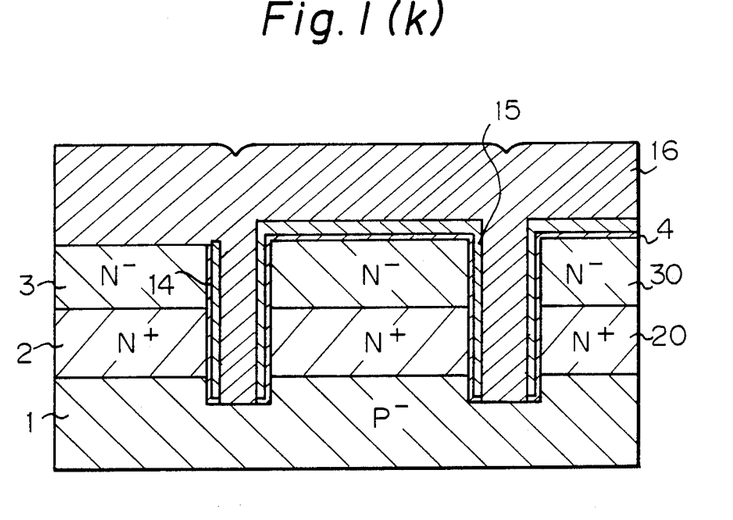

Next, polycrystalline silicon material is thickly deposited to bury the grooves 13 and to form a polycryslline silicon layer 16 of 4 to 5 μm in thickness (see FIG. 1(k)).

Figure 1L:
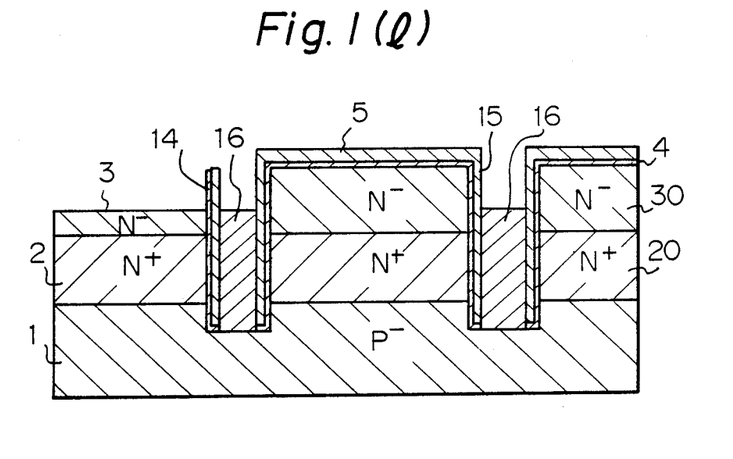

Next, a conventional dry etching process is carried out to the entire surface of the polycrystalline silicon layer 16 so as to expose the surface of the silicon nitride 5 on the active regions. Furthermore, the polycrystalline silicon layer is etched off to, preferably, 0.5 to 1 μm in depth, while the exposed epitaxial layer 3 is uniformly etched off so as to have the same surface as that of the polycrystalline silicon layer 16 in the groove 13 (see FIG. 1(l)).

Figure 1M:
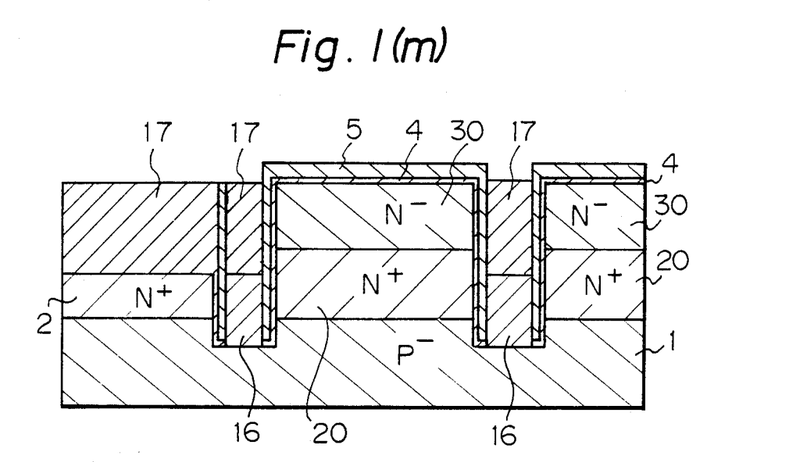

Next, the structure obtained above is subjected to an oxidation process to convert the N⁻ epitaxial silicon layer 3 and the polycrystalline silicon layer 16 into thick thermally grown silicon oxide regions 17. In this process, the grooves 13 are filled with silicon oxide so as to have the substantially same surface as that of the active regions (see FIG. 1(m)).

Figure 1N:
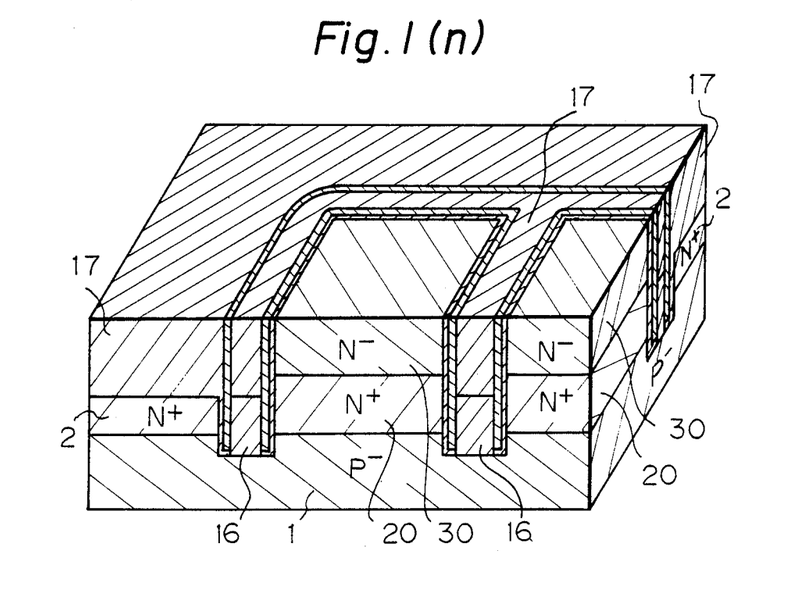

Thereafter, both the silicon oxide layer 4 and the silicon nitride layer 5 are completely removed to obtain a substantially planar surface on the silicon body (see FIG. 1(n)). Then, base and emitter regions are formed in the N⁻ collector regions 30 by conventional bipolar processes.

As described above, the method according to the invention does not require any additional photomasks for flatenning the surface of a semiconductor body. Also, this method can simultaneously form both narrower and deeper isolation regions of polycrystalline silicon and wider and thicker isolation regions of thermally-grown silicon oxide by using a single time time of photolithography process. Furthermore, The process can provide improved dielectric isolation regions which are free from bird's beaks or bird's heads, so that this can remarkably reduce element regions in size, and can provide a superior planar surface on a semiconductor body. This invention is applicable to the formation of MOS IC devices.

What is claimed is:

1. A method of making a semiconductor integrated circuit device comprising the steps of;
    sequentially forming on a top surface of a semiconductor body a first oxidation-resistant layer, a polycrystalline silicon layer on said first oxidation-resistant layer, a second oxidation-resistant layer on said polycrystalline silicon layer and an etching-resistant layer on said second oxidation-resistant mask layer;
    applying a photoresist layer on the entire surface of said etching-resistant layer;
    selectively removing said photoresist layer to form a photoresist mask having openings;
    said openings being walled by a first photoresist layer over a portion of said semiconductor body intended as a deeper isolation region and a second photoresist layer over a portion of semiconductor body intended as a wider isolation region;
    removing said second oxidation-resistant layer and said etching-resistant layer in said openings to expose a surface of said polycrystalline silicon layer;
    subjecting the structure obtained by said steps to an isotropic etching process to side-etch said etching-resistant layer under said second photoresist layer by a desired width, while said etching-resistant layer under said first photoresist layer is completely removed away;
    removing said first and second photoresist layers to expose said etching-resistant layer and said second oxidation-resistant layer;
    subjecting the structure obtained by said steps to a heat oxidation process to convert said exposed polycrystalline silicon layer into a silicon oxide layer;
    subjecting the structure obtained by said steps to an etching process to sequentially remove said exposed second oxidation-resistant layer, said polycrystalline silicon layer and said first oxidation-resistant layer; and
    subjecting the structure obtained by said steps to a reactive etching process to form deep grooves surrounding active regions in said semiconductor body by using as an etching mask said etching-resistant layer and said silicon oxide layer.

2. A method as claimed in claim 1 wherein said first and second oxidation-resistant layers are of silicon nitride, and said etching-resistant layer are of silicon oxide.

3. A method as claimed in claim 2 wherein said silicon nitride and said silicon oxide are formed by CVD process.

4. A method as claimed in claim 1 wherein said first oxidation-resistant layer is about 2000 Å in thickness, said second oxidation-resistant layer is 1000 to 2000 Å in thickness and said polycrystalline silicon layer is 200 to 3000 Å in thickness.

5. A method as claimed in claim 1 wherein said groove in 4 to 5 μm in depth.

6. A method as claimed in claim 1 wherein said semiconductor body is of a multi-layer of a P⁻ silicon layer, an N⁻ diffused layer and an N⁺ epitaxial silicon layer.

7. A method as claimed in claim 1 further comprising the steps of;
    exposing said portion of said semiconductor body intended as a wider isolation region;
    forming a third oxidation-resistant layer on the entire surface of the structure obtained above;
    selectively removing said third oxidation-resistant layer to expose said portion of said semiconductor body;
    depositing polycrystalline silicon on the entire surface of the structure obtained above to fill said grooves with said polycrystalline silicon;
    removing said polycrystalline silicon and said exposed portion of said semiconductor body to a desired depth from the top surface of said semiconductor body; said active region to be formed being remained
    subjecting the structure obtained above to an oxidation process to convert said exposed polycrystalline silicon and an exposed surface of said semiconductor body into a silicon oxide layer, whereby said silicon oxide layer has the substantially same surface of that of said active region.

* * * * *